United States Patent
Luan et al.

(10) Patent No.: US 7,361,538 B2
(45) Date of Patent: Apr. 22, 2008

(54) TRANSISTORS AND METHODS OF MANUFACTURE THEREOF

(75) Inventors: Hongfa Luan, Austin, TX (US); Prashant Majhi, Austin, TX (US)

(73) Assignees: Infineon Technologies AG, Munich (DE); Intel Corporation, Santa Clara, CA (US)

( * ) Notice: Subject to any disclaimer, the term of this patent is extended or adjusted under 35 U.S.C. 154(b) by 123 days.

(21) Appl. No.: 11/105,880

(22) Filed: Apr. 14, 2005

(65) Prior Publication Data
US 2006/0234433 A1 Oct. 19, 2006

(51) Int. Cl.
H01L 21/336 (2006.01)
H01L 21/8234 (2006.01)

(52) U.S. Cl. ............... 438/197; 438/753; 438/785; 257/E21.17; 257/E21.32; 257/E21.603; 257/E21.632

(58) Field of Classification Search .......... 438/197, 438/286, 287, 289, 290, 311, 513, 680, 722, 438/756, 743, 787, 753, 785
See application file for complete search history.

(56) References Cited

U.S. PATENT DOCUMENTS

| | | | |
|---|---|---|---|
| 4,432,035 A | 2/1984 | Hsieh et al. |
| 4,990,974 A | 2/1991 | Vinal |
| 5,041,885 A | 8/1991 | Gualandris et al. |
| 5,066,995 A | 11/1991 | Young et al. |
| 5,162,263 A | 11/1992 | Kunishima et al. |
| 5,321,287 A | 6/1994 | Uemura et al. |
| 5,763,922 A | 6/1998 | Chau |
| 5,994,747 A | 11/1999 | Wu |
| 6,020,243 A | 2/2000 | Wallace et al. |
| 6,027,961 A | 2/2000 | Maiti et al. |
| 6,048,769 A | 4/2000 | Chau |
| 6,084,280 A | 7/2000 | Gardner et al. |
| 6,124,171 A | 9/2000 | Arghavani et al. |
| 6,159,782 A | 12/2000 | Xiang et al. |
| 6,184,072 B1 | 2/2001 | Kaushik et al. |
| 6,225,163 B1 | 5/2001 | Bergemont |

(Continued)

FOREIGN PATENT DOCUMENTS

EP 1 388 889 A2 2/2004

(Continued)

OTHER PUBLICATIONS

Hobbs, C., et al., "Fermi Level Pinning at the PolySi/Metal Oxide Interface," 2003 Symposium on VLSI Technology Digest of Technical Papers, Jun. 2003, 2 pages.

(Continued)

*Primary Examiner*—David Nhu
(74) *Attorney, Agent, or Firm*—Slater & Matsil, L.L.P.

(57) ABSTRACT

Transistors and methods of manufacture thereof are disclosed. A workpiece is provided, a gate dielectric is formed over the workpiece, and a gate is formed over the gate dielectric by exposing the workpiece to a precursor of hafnium (Hf) and a precursor of silicon (Si). The gate includes and include respectively a layer of a combination of Hf and Si. The layer of the combination of Hf and Si of the gate establishes the threshold voltage $V_t$ of the transistor. The transistor may includes and include respectively a single NMOS transistor or an NMOS transistor of a CMOS device.

9 Claims, 5 Drawing Sheets

U.S. PATENT DOCUMENTS

| | | | |
|---|---|---|---|
| 6,291,867 B1 | 9/2001 | Wallace et al. | |
| 6,348,390 B1 | 2/2002 | Wu | |
| 6,410,967 B1 | 6/2002 | Hause et al. | |
| 6,444,555 B2 | 9/2002 | Ibok | |
| 6,475,908 B1* | 11/2002 | Lin et al. | 438/659 |
| 6,492,217 B1 | 12/2002 | Bai et al. | |
| 6,528,858 B1 | 3/2003 | Yu et al. | |
| 6,656,764 B1 | 12/2003 | Wang et al. | |
| 6,716,685 B2 | 4/2004 | Lahaug | |
| 6,720,221 B1 | 4/2004 | Ahn et al. | |
| 6,740,944 B1 | 5/2004 | McElheny et al. | |
| 6,852,645 B2 | 2/2005 | Colombo et al. | |
| 6,897,095 B1 | 5/2005 | Adetutu et al. | |
| 6,921,691 B1 | 7/2005 | Li et al. | |
| 7,060,568 B2 | 6/2006 | Metz et al. | |
| 7,091,568 B2* | 8/2006 | Hegde et al. | 257/410 |
| 2002/0005556 A1 | 1/2002 | Cartier et al. | |
| 2002/0053711 A1 | 5/2002 | Chau et al. | |
| 2002/0135030 A1 | 9/2002 | Horikawa | |
| 2002/0135048 A1 | 9/2002 | Ahn et al. | |
| 2002/0151125 A1 | 10/2002 | Kim et al. | |
| 2002/0153573 A1 | 10/2002 | Mogami | |
| 2003/0057432 A1 | 3/2003 | Gardner et al. | |
| 2003/0104663 A1 | 6/2003 | Visokay et al. | |
| 2003/0116804 A1 | 6/2003 | Visokay et al. | |
| 2003/0137017 A1 | 7/2003 | Hisamoto et al. | |
| 2003/0141560 A1 | 7/2003 | Sun | |
| 2003/0219953 A1 | 11/2003 | Mayuzumi | |
| 2004/0000695 A1 | 1/2004 | Matsuo | |
| 2004/0005749 A1 | 1/2004 | Choi et al. | |
| 2004/0009675 A1 | 1/2004 | Eissa et al. | |
| 2004/0023462 A1 | 2/2004 | Rotondaro et al. | |
| 2004/0132271 A1 | 7/2004 | Ang et al. | |
| 2004/0180487 A1 | 9/2004 | Eppich et al. | |
| 2004/0217429 A1 | 11/2004 | Lin et al. | |
| 2004/0242021 A1 | 12/2004 | Kraus et al. | |
| 2005/0035345 A1 | 2/2005 | Lin et al. | |
| 2005/0064663 A1 | 3/2005 | Saito | |
| 2005/0098839 A1 | 5/2005 | Lee et al. | |
| 2005/0101159 A1 | 5/2005 | Droopad | |
| 2005/0139926 A1 | 6/2005 | Shimizu et al. | |
| 2005/0224897 A1 | 10/2005 | Chen et al. | |
| 2005/0245019 A1 | 11/2005 | Luo et al. | |
| 2005/0280104 A1* | 12/2005 | Li | 257/406 |
| 2006/0003507 A1 | 1/2006 | Jung et al. | |
| 2006/0017112 A1 | 1/2006 | Wang et al. | |
| 2006/0038236 A1 | 2/2006 | Yamamoto | |
| 2006/0118879 A1* | 6/2006 | Li | 257/369 |
| 2006/0131652 A1* | 6/2006 | Li | 257/350 |
| 2006/0141729 A1 | 6/2006 | Wang et al. | |
| 2006/0211195 A1* | 9/2006 | Luan | 438/240 |
| 2007/0034945 A1 | 2/2007 | Bohr et al. | |

FOREIGN PATENT DOCUMENTS

| | | |
|---|---|---|
| EP | 1 531 496 A2 | 5/2005 |
| JP | 2002118175 | 4/2002 |
| JP | 2004289061 | 10/2004 |
| WO | WO 01/66832 A2 | 9/2001 |
| WO | WO 2004/095556 A1 | 11/2004 |
| WO | WO 2005/114718 A1 | 12/2005 |
| WO | WO 2006/061371 A1 | 6/2006 |
| WO | WO 2006/067107 A1 | 6/2006 |

OTHER PUBLICATIONS

Samavedam, S.B., et al., "Fermi Level Pinning with Sub-Monolayer MeOx and Metal Gates," Mar. 2003, 4 pages, IEEE.

"Front End Processes," International Technology Roadmap for Semiconductor (ITRS), 2002 Update, pp. 45-62, http://member.itrs.net/.

"High κ Dielectric Materials," Tutorial: Materials for Thin Films / Microelectronics, downloaded Jun. 9, 2004, 3 pages, Sigma-Aldrich Co., St. Lois, Missouri, US, http://www.sigmaaldrich.com/Area_of_Interest/Organic_Inorganic_Chemistry/Materials_Science/Thin_Films_Microelectronics/Tutorial/Dielectric_Materials.html.

Wolf, S., "Silicon Processing for the VLSI Era: vol. 2—Process Integration," 1990, pp. 432-441, Lattice Press, Sunset Beach, CA.

Guha, S., et al., "Atomic Beam Deposition of Lanthanum- and Yttrium-Based Oxide Thin Films for Gate Dielectrics," Applied Physics Letters, Oct. 23, 2000, vol. 77, No. 17, pp. 2710-2712, American Institute of Physics.

Muller, R.S., et al., "Device Electronics for Integrated Circuits," Second Ed., 1986, pp. 380-385, 398-399, John Wiley & Sons, New York, NY.

"Front End Processes," The International Technology Roadmap for Semiconductors: 2003 Edition, pp. 23-25, http://member.itrs.net/.

Gannavaram, S., et al., "Low Temperacture ($\leq$ 800° C.) Recessed Junction Selective Silicon-Germanium Source/Drain Technology for sub-70 nm CMOS," 2000, 4 pp., IEEE, Los Alamitos, CA.

Huang, F.-J., et al., "Schottky-Clamped NMOS Transitors Implemented in a Conventional 0.8-μm CMOS Process," IEEE Electron Device Letters, Sep. 1998, pp. 326-328, vol. 19, No. 9, IEEE, Los Alamitos, CA.

Park, D.-G., et al., "Thermally Robust Dual-Work Function ALD-$MN_x$ MOSFETs using Conventional CMOS Process Flow," 2004 Symposium on VLSI Technology Digest of Technical Papers, 2004, pp. 186-187, IEEE, Los Alamitos, CA.

Lin, R., et al., "An Adjustable Work Function Technology Using Mo Gate for CMOS Devices," IEEE Electron Device Letters, Jan. 2002, pp. 49-51, vol. 23, No. 1, IEEE, Los Alamitos, CA.

Hobbs, C.C., et al., "Fermi-Level Pinning at the Polysilicon/Metal Oxide Interface—Part I," IEEE Transactions on Electron Devices, vol. 51, No. 6, Jun. 2004, pp. 971-977.

Wakabayashi, H., et al., "A Dual-Metal Gate CMOS Technology Using Nitrogen-Concentration-Controlled $TiN_x$ Film," IEEE Transactions on Electron Devices, Oct. 2001, pp. 2363-2369, vol. 48, No. 10, IEEE, Los Alamitos, CA.

\* cited by examiner

TRANSISTORS AND METHODS OF MANUFACTURE THEREOF

TECHNICAL FIELD

The present invention relates generally to semiconductor devices, and more particularly to transistors and methods of manufacturing thereof.

BACKGROUND

Semiconductor devices are used in a variety of electronic applications, such as personal computers, cell phones, digital cameras, and other electronic equipment, as examples. Semiconductor devices are typically fabricated by sequentially depositing insulating (or dielectric) layers, conductive layers, and semiconductive layers of material over a semiconductor substrate, and patterning the various layers using lithography to form circuit components and elements thereon.

A transistor is an element that is utilized extensively in semiconductor devices. There may be millions of transistors on a single integrated circuit (IC), for example. A common type of transistor used in semiconductor device fabrication is a metal oxide semiconductor field effect transistor (MOSFET).

Early MOSFET processes used one type of doping to create single transistors that comprise either positive or negative channel transistors. Other more recent designs, referred to as complimentary MOS (CMOS) devices, use both positive and negative channel devices, e.g., a positive channel metal oxide semiconductor (PMOS) transistor and a negative channel metal oxide semiconductor (NMOS) transistor, in complimentary configurations. An NMOS device negatively charges so that the transistor is turned on or off by the movement of electrons, whereas a PMOS devices involves the movement of electron vacancies. While the manufacturing of CMOS devices requires more manufacturing steps and more transistors, CMOS devices are advantageous because they utilize less power, and the devices may be made smaller and faster.

The gate dielectric for MOSFET devices has in the past typically comprised silicon dioxide, which has a dielectric constant of about 3.9. However, as devices are scaled down in size, using silicon dioxide for a gate dielectric becomes a problem because of gate leakage current, which can degrade device performance. Therefore, there is a trend in the industry towards the development of the use of high dielectric constant (k) materials for use as the gate dielectric in MOSFET devices. The term "high k dielectric materials" as used herein refers to a dielectric material having a dielectric constant of about 4.0 or greater, for example.

High k gate dielectric material development has been identified as one of the future challenges in the 2002 edition of International Technology Roadmap for Semiconductors (ITRS), incorporated herein by reference, which identifies the technological challenges and needs facing the semiconductor industry over the next 15 years. For low power logic (for portable electronic applications, for example), it is important to use devices having low leakage current, in order to extend battery life. Gate leakage current must be controlled in low power applications, as well as sub-threshold leakage, junction leakage, and band-to-band tunneling.

In electronics, the "work function" is the energy, usually measured in electron volts, needed to remove an electron from the Fermi level to a point an infinite distance away outside the surface. Work function is a material property of any material, whether the material is a conductor, semiconductor, or dielectric. The work function of a metal is a fixed value. The work function of a semiconductor can be changed by doping the semiconductor material. For example, undoped polysilicon has a work function of about 4.65 eV, whereas polysilicon doped with boron has a work function of about 5.15 eV. The work function of a semiconductor or conductor directly affects the threshold voltage of a transistor when the material is used as a gate electrode.

In prior art CMOS devices utilizing $SiO_2$ as the gate dielectric material, the work function of a CMOS device could be changed or tuned by doping the polysilicon used for the gate electrode material. However, high-k gate dielectric materials such as hafnium-based dielectric materials exhibit a Fermi-pinning effect, which is caused by the interaction of the high-k gate dielectric material with the adjacent gate material. When used as a gate dielectric, some types of high k gate dielectric material can pin or fix the work function, so that doping the polysilicon gate material does not change the work function. Thus, a symmetric $V_t$ for the NMOS and PMOS transistors of a CMOS device having a high k dielectric material for the gate dielectric cannot be achieved by doping polysilicon gate material, as in $SiO_2$ gate dielectric CMOS devices.

The Fermi-pinning effect of high k gate dielectric materials causes a threshold voltage shift and low mobility, due to the increased charge caused by the Fermi-pinning effect. Fermi-pinning of high k gate dielectric material causes an assymmetric turn-on threshold voltage $V_t$ for the transistors of a CMOS device, which is undesirable. Efforts have been made to improve the quality of high-k dielectric films and resolve the Fermi-pinning problems, but the efforts have resulted in little success.

Thus, metal gate electrodes with a suitable work function are needed.

In particular, what is needed in the art is an N-type metal gate electrode having a work function of about 4.1 eV±about 0.05 eV for an NMOS transistor, and a P-type metal gate electrode having a work function of about 5.2 eV±about 0.05 eV for a PMOS transistor. Such work functions will result in a CMOS transistor device and method of manufacturing thereof that will have a high-k gate dielectric material and a symmetric $V_t$ for the p channel metal oxide semiconductor (PMOS) and n channel metal oxide semiconductor (NMOS) transistors of the CMOS device.

SUMMARY OF THE INVENTION

These and other problems are generally solved or circumvented, and technical advantages are generally achieved, by preferred embodiments of the present invention, which comprise novel structures and methods of forming a gate electrode of an NMOS device.

In accordance with a preferred embodiment of the present invention, a transistor includes a gate comprising a layer of a combination of hafnium (Hf) and silicon (Si). The ratio of amount of Hf with respect to the amount of Si can be changed. The Hf—Si based transistor gate may also include some amounts of oxygen, carbon, nitrogen in the film due to deposition contamination, for example.

In accordance with yet another preferred embodiment of the present invention, a method of manufacturing a semiconductor device includes providing a workpiece, forming a gate dielectric material over the workpiece, and exposing the workpiece to a precursor of Hf and a precursor of Si to form a gate material over the gate dielectric material, the gate material comprising a layer of a combination of Hf and Si.

The gate material and the gate dielectric material are patterned to form a gate and a gate dielectric of a transistor, respectively. A source region and a drain region are formed in the workpiece proximate the gate dielectric.

Advantages of preferred embodiments of the present invention include providing novel methods of fabricating transistor devices. CMOS devices may be manufactured wherein the PMOS transistor and NMOS transistor of the CMOS devices have a substantially symmetric $V_t$. The gate of the NMOS transistor comprising a layer of a combination of Hf and Si sets the work function of the NMOS transistor gate electrode. The layer of the combination of Hf and Si of the gate establishes the threshold voltage $V_t$ of the transistor.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

When used as a gate dielectric of a transistor, the use of high-k gate dielectric materials have generally been shown to yield orders of magnitude lower gate leakage current than $SiO_2$ gate dielectric materials with the same effective oxide thickness (EOT). For low standby power (LSTP) and high performance (HP) applications, a high-k gate dielectric is a potential solution in the roadmap for the advanced technology nodes. High k gate dielectric materials are expected to achieve the EOT, gate leakage ($J_g$), mobility, and hysteresis parameters required by LSTP applications.

However, $V_t$ controllability with high k gate dielectric materials is proving challenging. For example, in order for high k gate dielectric materials to be useful in CMOS applications, a CMOS device requires a symmetrical $V_{tn}$ and $V_{tp}$ (e.g., $V_{tn}$=+0.3 V and $V_{tp}$=−0.3 V).

Attempts to use high-k dielectric materials as a gate dielectric material have been problematic. In particular, attempts have been made to use $HfO_2$, which is a high-k dielectric material having a dielectric constant of about 25, as a gate dielectric for the PMOS and NMOS FETs of a CMOS device. If polysilicon is used as a gate material, the work function of the polysilicon gate using a $HfO_2$ gate dielectric has been found to be pinned, as a result of Fermi-pinning, at a point close to the conduction band of polysilicon, causing the polysilicon gate to function as N type polysilicon, even for a polysilicon gate doped with P type dopant, for the PMOS device. This has been found to cause asymmetric threshold voltages $V_t$ for the PMOS and NMOS transistors of CMOS devices. Polysilicon used as gate electrode will also cause a poly depletion problem, for example.

Because the Fermi-pinning effect makes polysilicon incompatible for use as a gate material (e.g., used directly adjacent the gate dielectric), it is desirable to find a metal that may be used for PMOS and NMOS devices as a gate material. In particular, it is desirable to find a metal that provides a work function of about 4.1 eV for an n-type device (e.g., an NMOS transistor).

Embodiments of the present invention achieve technical advantages by disclosing a metal that is useful as a gate material in an NMOS transistor, either in a single NMOS transistor or in an NMOS transistor of a CMOS device. The gate comprises a layer of a combination of Hf and Si. Advantageously, the work function of a gate comprising a combination of Hf and Si formed in accordance with embodiment of the present invention was found to be about 4.0 eV. The gate material comprising Hf and Si of the NMOS transistor sets the work function of the gate electrode and avoids Fermi-pinning effects caused by the use of high k dielectric materials for the gate dielectric. In some embodiments, the gate of the NMOS transistor may also include a layer of semiconductive material disposed at a top surface thereof, for example.

The present invention will be described with respect to preferred embodiments in a specific context, namely in a single NMOS transistor or in an NMOS transistor of a CMOS transistor. Embodiments of the present invention may also be applied, however, to other semiconductor device applications where one or more transistors are utilized, as examples. Note that in the drawings shown, only one NMOS transistor is shown, or one CMOS device comprising one NMOS transistor and one PMOS transistor is shown; however, there may be many transistors formed on a semiconductor workpiece during each of the manufacturing processes described herein.

Figure 1:
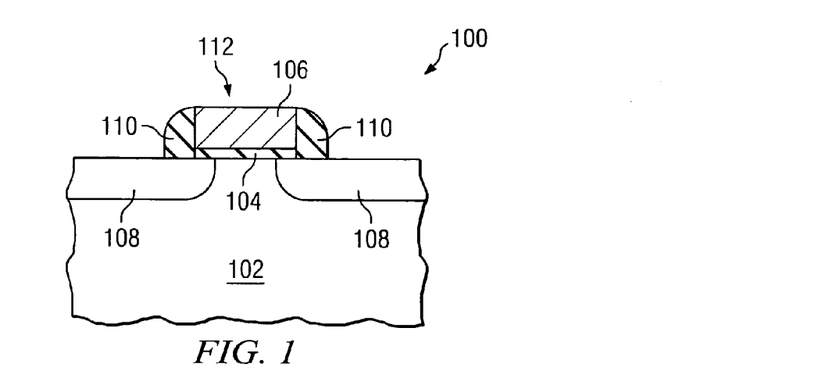
FIG. 1 shows a cross-sectional view of a semiconductor device in accordance with a preferred embodiment of the present invention, wherein a semiconductor device comprises a transistor having a gate comprising a layer of a combination of hafnium (Hf) and silicon (Si)

FIG. 1 shows a cross-sectional view of a semiconductor device 100 in accordance with a preferred embodiment of the present invention. With reference now to FIG. 1, there is shown a semiconductor device 100 in a cross-sectional view including a workpiece 102. The workpiece 102 may include a semiconductor substrate comprising silicon or other semiconductor materials covered by an insulating layer, for example. The workpiece 102 may also include other active components or circuits, not shown. The workpiece 102 may comprise silicon oxide over single-crystal silicon, for example. The workpiece 102 may include other conductive layers or other semiconductor elements, e.g., transistors, diodes, etc. Compound semiconductors, GaAs, InP, Si/Ge, or SiC, as examples, may be used in place of silicon. The workpiece 102 may also comprise a silicon-on-insulator (SOI) substrate.

The workpiece 102 may be doped with P type dopants, e.g., to form a P well. The workpiece 102 may be cleaned using a pre-gate clean process to remove contaminants or native oxide from the top surface of the workpiece 102. The pre-gate treatment may comprise a HF, HCl or ozone based cleaning treatment, as examples, although the pre-gate treatment may alternatively comprise other chemistries.

A gate dielectric material 104 is formed over the workpiece 102. The gate dielectric material 104 preferably comprises a high k dielectric material having a dielectric constant of about 4.0 or greater, in one embodiment, for example. The gate dielectric material 104 may alternatively comprise a dielectric material such as $SiO_2$, for example. The gate dielectric material 104 preferably comprises $HfO_2$, $HfSiO_x$, $Al_2O_3$, $ZrO_2$, $ZrSiO_x$, $Ta_2O_5$, $La_2O_3$, nitrides thereof, $Si_xN_y$, SiON, $HfAlO_x$, $HfAlOxN_{1-x-y}$, $ZrAlO_x$, $ZrAlO_xN_y$, $SiAlO_x$, $SiAlON_{1-x-y}$, $HfSiAlO_x$, $HfSiAlO_xN_y$, $ZrSiAlO_x$, $ZrSiAlO_xN_y$, $SiO_2$, combinations thereof, or multiple layers thereof, as examples, although alternatively, the gate dielectric material 104 may comprise other high k dielectric materials or other dielectric materials.

The gate dielectric material 104 may comprise a single layer of material, or alternatively, the gate dielectric material 104 may comprise two or more layers. In one embodiment, one or more of these materials can be included in the gate dielectric material 104 in different combinations or in stacked layers. The gate dielectric material 104 may be formed by chemical vapor deposition (CVD), atomic layer deposition (ALD), metal organic chemical vapor deposition (MOCVD), physical vapor deposition (PVD), or jet vapor deposition (JVD), as examples, although alternatively, the gate dielectric material 104 may be formed using other techniques.

The gate dielectric material 104 preferably comprises a thickness of about 50 Angstroms or less in one embodiment, although alternatively, the gate dielectric material 104 may comprise other dimensions, such as about 80 Angstroms or less, as an example. The gate dielectric material 104 preferably comprises about 10 Angstroms, in one embodiment, for example.

In one embodiment, the gate dielectric material 104 preferably comprises about 100 Angstroms of $SiO_2$ disposed over the workpiece 102 and about 30 Angstroms of $HfSiO_2$ disposed over the $SiO_2$. Alternatively, the gate dielectric material 104 may comprise other materials, combinations of materials, and thicknesses, as examples.

Next, a gate material 106 is formed over the gate dielectric material 104, also shown in FIG. 1. The gate material 106 preferably comprises a layer of a combination of Hf and Si in accordance with embodiments of the present invention. The gate material 106 is preferably deposited using MOCVD in one embodiment, although alternatively, the gate material 106 may be formed by ALD, PVD, or other deposition techniques, as examples.

The gate material 106 is preferably formed by exposing the workpiece 102 (e.g., the top surface of the gate dielectric material 104) to a precursor of hafnium (Hf) and a precursor of silicon (Si) to form the gate material 106 over the gate dielectric material 104, the gate material 106 comprising a layer of a combination of Hf and Si. The precursor of Hf may comprise TDEAH, $Hf(NEt_2)_4$, or TEMAH, and the precursor of Si may comprise TDMAS, Tetrakis (dimethylamido), $[CH_2)_2N]_4Si$, or $SiH_4$, as examples. The gate material 106 preferably comprises a first thickness. In one embodiment, the amount of Hf in the gate material 106 is substantially the same through the entire first thickness of the gate material 106, and the amount of Si is substantially the same through the entire first thickness of the gate material 106, for example. For example, the percentage of Hf and the percentage of Si is substantially the same at the bottom of the gate material 106 as at the middle and/or top of the gate material 106. In particular, the ratio of the amount of Hf and the amount of Si is substantially the same throughout the entire first thickness of the gate material 106, in one embodiment.

The gate material 106 may be formed by placing the workpiece 102 into a deposition chamber, and introducing the precursor of Hf and the precursor of Si into the deposition chamber using a carrier gas such as nitrogen ($N_2$), although other carrier gases may also be used. As an example, the carrier gas may alternatively comprise argon (Ar) or other types of carrier gases used with precursors, for example. The temperature during the deposition process may comprise about 400 to 700 degrees C., for example, although alternatively, other temperatures may be used.

In the embodiment shown in FIG. 1, the gate material 106 preferably comprises a thickness of about 2,000 Angstroms or less. More preferably, the gate material 106 may comprise a thickness of about 1,000 to 1,500 Angstroms, and most preferably, the gate material 106 comprises a thickness of about 1,000 Angstroms, in some embodiments. Alternatively, the gate material 106 comprising the layer of a combination of Hf and Si may comprise other dimensions. For example, in one embodiment, if the gate of the transistor includes a layer of semiconductive material disposed over the layer of the combination of Hf and Si 106 (not shown in FIG. 1; see FIG. 2), then the gate material 106 may be thinner, e.g., about 500 Angstroms or less.

The gate material 106 comprising the layer of the combination of Hf and Si may comprise about 10% or less of oxygen (O), carbon (C), nitrogen (N), or combinations thereof. For example, oxygen from the gate dielectric material 104 or from the air in the deposition chamber may form in the gate material 106, forming HfSiO. Carbon and nitrogen may be present in the precursor of Hf and/or the precursor of Si, forming HfSiC, HfSiN, HfSiCN, or HfSiNC. The presence of O, C, and/or N may form combinations of Hf and Si with O, C, and/or N, such as HfSiO, HfSiC, HfSiN, HfSiCN, HfSiNC, HfSiOC, HfSiON, or HfSiOCN, as examples.

The ratio of the Hf and Si may vary. For example, the gate material 106 may comprise a percentage of about 20 to 80% of Hf and about 80 to 20% of Si, although alternatively, the gate material 106 may comprise other percentages of Hf and Si. As an example, the gate material 106 may comprise about 20% Hf and about 80% Si throughout substantially the entire thickness of the gate material 106 layer. Alternatively, the gate material 106 may comprise about 80% Hf and about 20% Si throughout substantially the entire thickness of the gate material 106 layer. Alternatively, for example, the gate material 106 may comprise about 50% Hf and about 50% Si throughout substantially the entire thickness of the gate material 106 layer. The ratio of Si:Hf may comprise about 0.30 in one embodiment, for example. If the gate material 106 comprises O, C, and/or N, the percentage of the Hf and/or Si is reduced accordingly, for example. The gate material 106 may comprise a crystalline or amorphous material in accordance with embodiments of the present invention.

Next, the gate material 106 and the gate dielectric material 104 are patterned using lithography to form a gate 106 and a gate dielectric 104 of a transistor 112, respectively, as shown in FIG. 1. For example, a layer of photoresist (not shown) may be deposited over the gate material 106, and the photoresist may be patterned using a lithography mask and an exposure process. The photoresist is developed, and the photoresist is used as a mask while portions of the gate material 106 and gate dielectric material 104 are etched away.

The workpiece 102 may be implanted with dopants to form source and drain regions 108 proximate the gate dielectric 104. Spacers 110 comprising an insulating material such as an oxide, nitride, or combinations thereof, may be formed over the sidewalls of the gate 106 and gate dielectric 104, as shown in FIG. 1.

Processing of the semiconductor device 100 is then continued, such as forming insulating and conductive layers over the transistor 112, as examples (not shown). For example, one or more insulating materials (not shown) may be deposited over the transistor 112, and contacts may be formed in the insulating materials in order to make electrical contact with the gate 106, and source and/or drain regions 108. Additional metallization and insulating layers may be formed and patterned over the top surface of the insulating material and contacts. A passivation layer (not shown) may be deposited over the insulating layers or the transistor 112. Bond pads (also not shown) may be formed over contacts, and a plurality of the semiconductor devices 100 may then be singulated or separated into individual die. The bond pads may be connected to leads of an integrated circuit package (not shown) or other die, for example, in order to provide electrical contact to the transistors 112 of the semiconductor device.

The transistor 112 preferably comprises a single NMOS transistor in one embodiment. The Hf—Si based gate 106 causes the gate 106 (also referred to herein as a gate electrode) to have a work function of about 3.9 to about 4.1 eV, in one embodiment. The transistor 112 has a threshold voltage of about −0.3 V in one embodiment.

For example, the work function of gate materials can generally be determined from Equation 1 below:

Equation 1:
$$V_{fb} = \Phi'_{ms} - \frac{Q_f * EOT}{\varepsilon_{ox}};$$

wherein $V_{fb}$ is the flat band voltage, $\Phi'_{ms}$ is the work function difference between the Hf—Si gate 106 and the Si substrate 102 (or workpiece), $Q_f$ represents the interface charge between the gate dielectric 104 and the substrate 102 (which may comprise Si), EOT is the effective oxide thickness of the gate dielectric 104, and $\varepsilon_{ox}$ is dielectric constant of the gate dielectric 104, for example. When $V_{fb}$ is plotted vs. EOT, $\Phi'_{ms}$ can be obtained from intercept, for example. $\Phi'_{ms} = \Phi_m - \Phi_s$, which is the work function difference between the gate electrode 106 and the substrate 102, for example. $\Phi_s$ can be obtained from the substrate or workpiece 102, and $\Phi_m$ can be obtained from $\Phi'_{ms}$ and $\Phi_s$.

Figure 2:
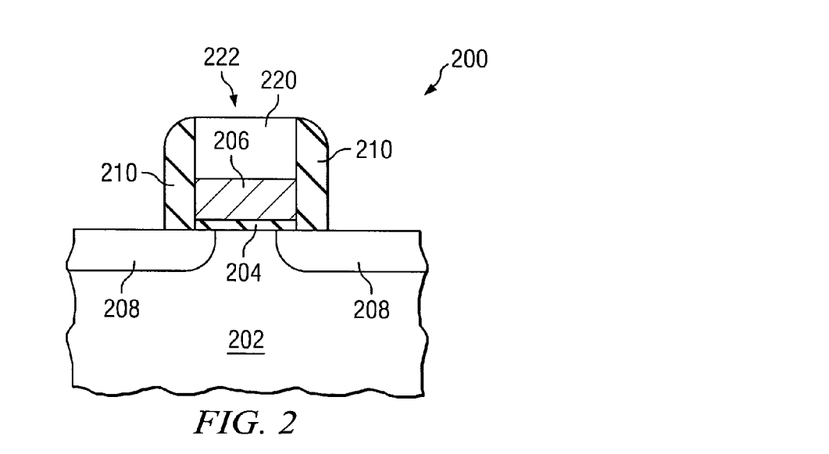
FIG. 2 shows a cross-sectional view of another embodiment of the present invention, wherein a semiconductor device includes a gate comprising a layer of a combination of Hf and Si and a layer of semiconductive material disposed over the layer of the combination of Hf and Si.

Another preferred embodiment of the present invention is shown in FIG. 2 in a cross-sectional view. The first digit of each reference numeral for FIG. 2 is a "2", and the last two digits of each reference numeral are the same as were used in FIG. 1, and to avoid repetition, the descriptions of the elements and formation thereof are not repeated herein.

In this embodiment, the layer of a combination of Hf and Si 206 preferably comprises a thickness of about 500 Angstroms or less. More preferably, the layer of the combination of Hf and Si 206 comprises about 50 to 200 Angstroms, and most preferably, the layer of the combination of Hf and Si 206 comprises about 50 to 100 Angstroms. The layer of the combination of Hf and Si 206 may alternatively comprise other dimensions in this embodiment, for example.

In this embodiment, a layer of semiconductive material 220 is formed over the layer of the combination of Hf and Si 206. The layer of semiconductive material 220 and the layer of the combination of Hf and Si 206 comprise the gate of the transistor 200 in this embodiment. The layer of semiconductive material 220 preferably comprises polysilicon, although alternatively, the layer of semiconductive material 220 may comprise other materials. The layer of semiconductive material 220 preferably comprises a thickness of about 2,000 Angstroms or less. More preferably, in one embodiment, the layer of semiconductive material 220 may comprise a thickness of about 1,000 Angstroms, for example. The layer of semiconductive material 220 may alternatively comprise other dimensions.

After depositing the layer of semiconductive material 220, the layer of semiconductive material 220 is preferably doped using an implantation process with dopants. For example, if the transistor 222 comprises an NMOS transistor, the semiconductive material 220 is preferably implanted with an N type dopant. Alternatively, the semiconductive material 220 may be implanted with a P type dopant, for example. For example, the semiconductive material 220 may be N doped by doping the semiconductive material 220 with phosphorus or arsenic (As). Alternatively, in another embodiment, the semiconductive material 220 may be P doped by doping the semiconductive material 220 with boron (B).

After implanting the semiconductive material 220 with a dopant, the layer of semiconductive material 220, the layer of the combination of Hf and Si 206, and the gate dielectric material 204 are patterned, and processing of the semiconductor device 200 is then continued as described with reference to FIG. 1.

Figure 3:
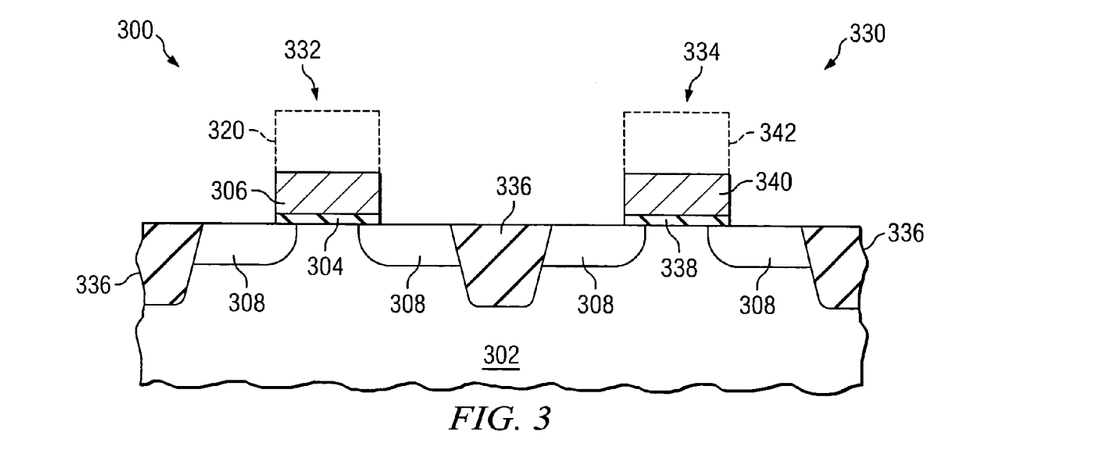
FIG. 3 shows yet another embodiment of the present invention in a cross-sectional view, wherein an NMOS transistor of a CMOS device comprises a layer of a combination of Hf and Si.

FIG. 3 shows an embodiment of the present invention implemented in a CMOS device 330, in a cross-sectional view. Again, like numerals are used in FIG. 3 as were used in the previous embodiments.

In this embodiment, the semiconductor device 300 includes CMOS device 330 including an NMOS transistor 332 comprising a gate comprised of the novel layer of a combination of Hf and Si 306 described herein, and a PMOS transistor 334 comprising a gate dielectric 338 and a gate 340 that comprises a different material than the material of the layer of a combination of Hf and Si 306 of the NMOS transistor 332. The region of the workpiece 302 that the PMOS transistor 334 is formed in may be doped with N type dopants to form an N well, and the region of the workpiece 302 that the NMOS transistor 332 is formed in may be doped with P type dopants to form a P well, for example. In general, the workpiece 102 is doped with N or P type dopants depending on whether the junctions of the transistors to be formed will be P or N type, respectively.

An STI region 336 may be formed between the NMOS transistor 332 and the PMOS transistor 334, and between adjacent transistors 332/334, as shown. An optional layer of polysilicon 320 and 342 may be formed over the layer of a combination of Hf and Si 306 of the NMOS transistor 332 and the gate 340 of the PMOS transistor 334, as shown in phantom, and as described with reference to FIG. 2, for example.

The material layer 340 of the gate of the PMOS transistor 334 preferably comprises a metal other than HfSi or HfSi optionally combined with O, C, and/or N, in one embodiment. For example, the material layer 340 may comprise TiSiN, TaCN, Pt, Ir, Ru, MoN, or WN, in one embodiment. The material layer 340 may be formed by masking the patterned material layers 306/320 of the NMOS transistor 332 during the depositing of the material layer 340, or by depositing the material layer 340 over the material layers 306/320 and then removing them, for example. The material layers 340 and/or 342 may be formed before or after the material layers 306/320 are deposited, for example. Processing of the semiconductor device 300 is then continued, as described with reference to FIG. 1. In one embodiment, the material layers 320 and 342 may comprise the same material and may be deposited at the same time, for example.

By using a different material for the gate of the PMOS transistor 334, a symmetric $V_t$ for the PMOS transistor 334 and the NMOS transistor 332 of the CMOS device 330 can be achieved. In particular, a NMOS transistor 332 having a gate with a work function of about 4.0 eV, e.g., between about 3.9 and 4.1 eV, can be achieved in accordance with embodiments of the present invention.

Embodiments of the present invention achieve technical advantages by providing a novel material for use as an NMOS transistor gate material. The Hf—Si-based gate material provides an NMOS gate material having a work function of about 4.1 eV. The work function does not vary when used on a high dielectric constant gate dielectric material, or on a $SiO_2$ gate dielectric material. The doping of an overlying semiconductive material, e.g., with either N-type or P-type doping, does not cause a significant variation in the work function of a transistor having a HfSi-based gate.

Experiments were performed on a plurality of wafers. The wafers were first cleaned using an ozone cleaning step, and a gate dielectric material and gate material were formed over the wafers.

Some of the wafers (referred to herein as the first wafer set) comprised a gate dielectric comprising about 20 to 80 Angstroms of $SiO_2$ and having a gate comprising about 100 Angstroms of HfSi and about 1,500 Angstroms of polysilicon disposed over the HfSi. The work function of this gate electrode with these parameters and with the polysilicon doped with N type ranged from about 4.05 to 4.14 eV. The work function of this gate electrode with these parameters and with the polysilicon doped with P type ranged from about 4.02 to 4.07 eV.

Some of the wafers (referred to herein as the second wafer set) comprised a gate dielectric comprising about 20 to 80 Angstroms of $SiO_2$ and about 30 Angstroms of HfSiO disposed over the $SiO_2$. These wafers comprised a gate comprising about 100 Angstroms of HfSi and about 1,500 Angstroms of polysilicon disposed over the HfSi. A post deposition anneal (PDA) in an ambient of $NH_3$ at 700 degrees C. at 30 Torr for 60 seconds was performed on these wafers. The work function of this gate electrode with these parameters and with the polysilicon doped with N type ranged from about 3.95 to 4.07 eV. The work function of this gate electrode with these parameters and with the polysilicon doped with P type ranged from about 4.06 to 4.09 eV.

Thus, regardless of the gate dielectric material and the doping of the gate polysilicon top layer, advantageously, the work function of transistors with a layer of HfSi disposed over and abutting the gate dielectric was found to be stable and range from about 3.9 to about 4.1 eV.

Figure 4:
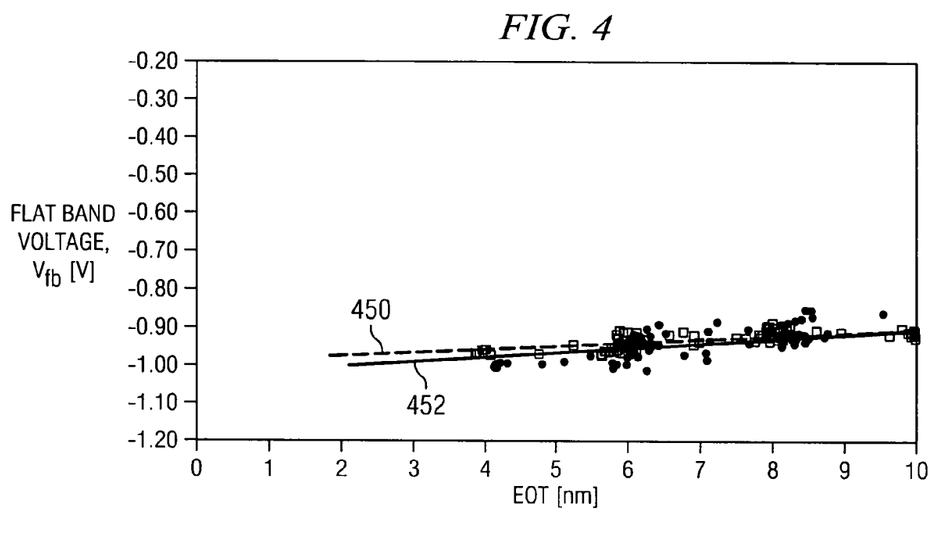
FIGS. 4 through 10 are graphs illustrating experimental results of implementing embodiments of the present invention at various test conditions and device configurations, indicating that Hf—Si as a gate material is an effective way of achieving a work function of about 3.9 to about 4.1 eV.

Experimental results of using the novel layer of a combination of Hf and Si as a gate electrode material for a NMOS devices are shown in FIGS. 4 through 10. Referring first to FIG. 4, a graph of the flat band voltage $V_{fb}$ in volts (V) vs. effective oxide thickness (EOT) in nm is shown for a wafer from the first wafer set described above at 450 and for a wafer from the second wafer set described above at 452. The wafer from the first wafer set (450) had a work function of 4.09 eV and an interface change density ($N_f$) of $-1.78 \times 10^{11}/cm^2$. The wafer from the second wafer set (452) had a work function of 4.05 eV and an $N_f$ of $-2.51 \times 10^{11}/cm^2$. Thus, the high k dielectric material made no significant difference in the work function, when a Hf—Si gate material was used.

A capacitance test is often used to measure capacitance vs. voltage in order to extract the work function of a gate electrode, such as the gate electrodes of transistors 112, 222, and 332 described herein. The capacitance of a capacitor comprising the gate 106, 206/220, 306, or 306/320 (e.g., which comprises a top capacitor plate), a capacitor dielectric comprising the gate dielectric 104, 204, or 304 and the workpiece 102, 202, or 302 (e.g., the bottom plate) is measured by applying a voltage to the gate with a workpiece being grounded. The source and drain regions 108, 208, and 308 are disregarded or left electrically unconnected for the capacitance test, for example.

Figure 5:
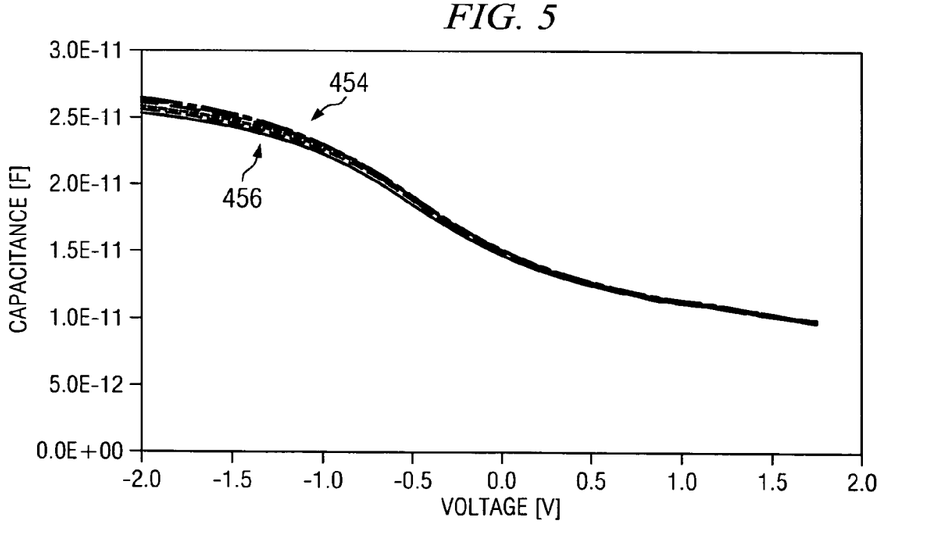

FIG. 5 illustrates a graph of capacitance in farads (F) vs. voltage (V) for NMOS capacitors (e.g., comprising the gates 106, 206/220, 306, or 306/320, gate dielectric 104, 204, or 304, and the workpiece 102, 202, or 302) in capacitance tests of transistors manufactured in the first and second wafer sets described above. The C-V curve is substantially the same for a wafer from the first wafer set, shown at 454, as for a wafer from the second wafer set, shown at 456. Thus, the high k dielectric material made no significant difference in the C-V function of the capacitors, when a Hf—Si gate material was used.

Figure 6:
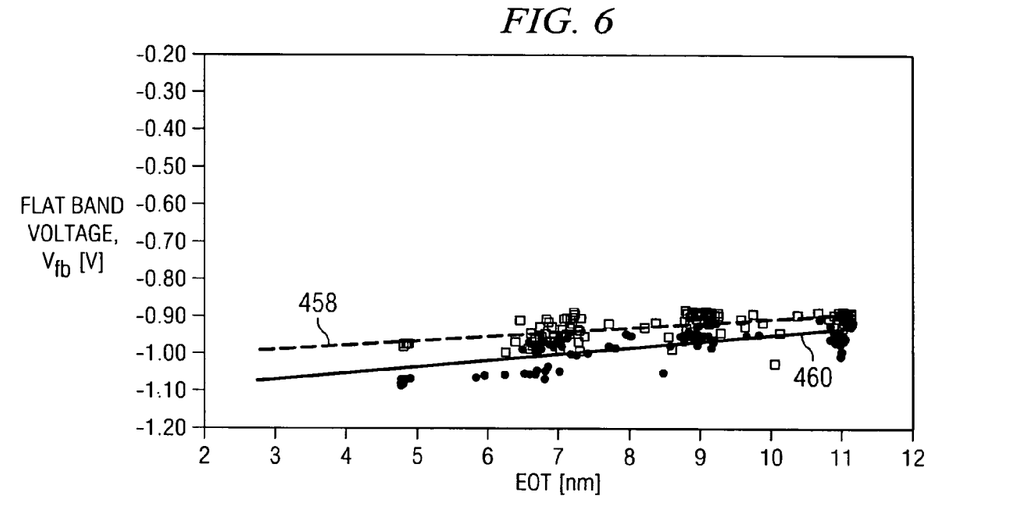

FIG. 6 illustrates a graph of the flat band voltage $V_{fb}$ vs. EOT for a wafer from the first wafer set described above at 458 and for a wafer from the second wafer set described above at 460. The recipe was changed compared to the wafer test results shown in FIG. 4, for example. The wafer from the first wafer set (458) had a work function of 4.05 eV and an $N_f$ of $-2.51 \times 10^{11}/cm^2$. The wafer from the second wafer set (460) had a work function of 3.95 eV and an $N_f$ of $-3.59 \times 10^{11}/cm^2$. Thus, again the high k dielectric material made no significant difference in the work function when a Hf—Si gate material was used.

Figure 7:
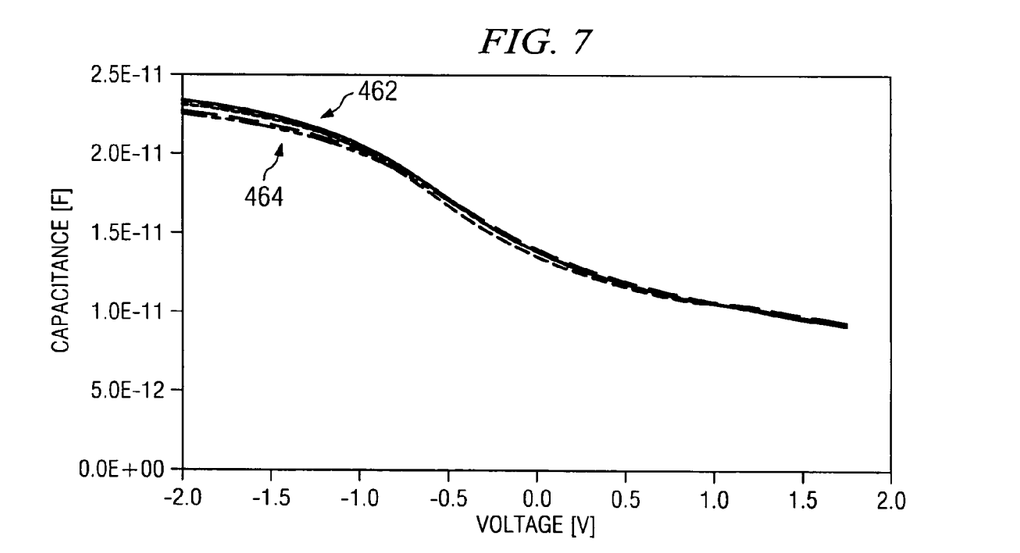

FIG. 7 illustrates a graph of capacitance vs. voltage for NMOS capacitors manufactured in the first and second wafer sets described above. The C-V curve is substantially the same for a wafer from the first wafer set, shown at 462, as for a wafer from the second wafer set, shown at 464. Thus, the high k dielectric material made no significant difference in the C-V function of the capacitors, when a Hf—Si gate material was used.

Figure 8:
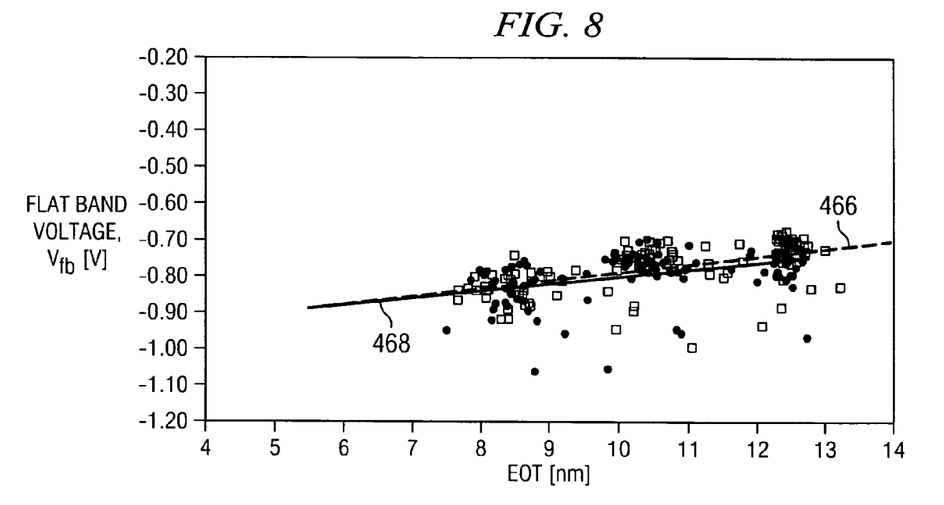
Figure 9:
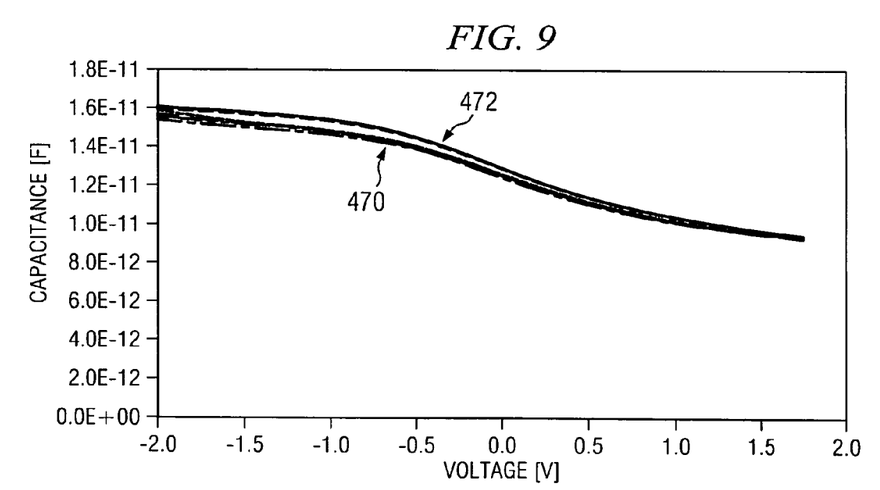

In the graphs shown in FIG. 4 through 7, the polysilicon disposed over the Hf—Si gate material was doped with N type. FIGS. 8 and 9 show $V_{fb}$ vs. EOT and C vs. V for wafers in which the polysilicon disposed over the Hf—Si gate material was doped with P type. In FIG. 8, $V_{fb}$ vs. EOT for a wafer from the first wafer set described above at 466 and for a wafer from the second wafer set described above at 468 is shown. The wafer from the first wafer set (466) had a work function of 4.09 eV and an $N_f$ of $-4.03\times10^{11}/cm^2$. The wafer from the second wafer set (468) had a work function of 4.07 eV and an $N_f$ of $-4.58\times10^{11}/cm^2$. Thus, again the high k dielectric material made no significant difference in the work function when a Hf—Si gate material was used, and when the polysilicon gate top portion was doped with P type.

FIG. 9 illustrates a graph of C vs. V for NMOS capacitors manufactured in the first and second wafer sets described above. The C-V curve is substantially the same for a wafer from the first wafer set, shown at 470, as for a wafer from the second wafer set, shown at 472. Thus, the high k dielectric material again made no significant difference in the C-V function of the capacitors, when a Hf—Si gate material was used, and when the polysilicon gate top portion was doped with P type.

Figure 10:
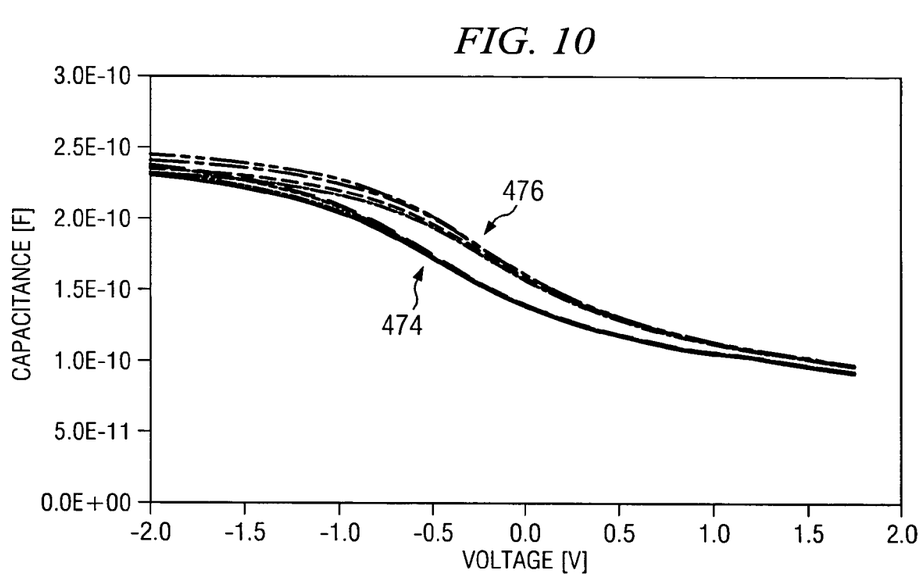

FIG. 10 shows a graph of C vs. V for capacitor having a HfSi gate disposed over an $HfSiO_2$ gate dielectric at 474 and for capacitors having a TiN gate and $HfSiO_2$ gate dielectric at 476. The difference in the C-V curve can be seen, from using TiN as a gate material, and using the novel Hf—Si gate material described herein, which indicates the work function difference between HfSi gate electrode and TiN gate electrode.

Thus, novel semiconductor devices 100, 200, and 300 comprising transistors 112, 222, and 332 having a gate comprised of a layer of a combination of Hf and Si 106, 206, and 306 are formed in accordance with embodiments of the present invention. Advantages of preferred embodiments of the present invention include providing methods of fabricating semiconductor devices 100, 200, and 300 and structures thereof. In the embodiment shown in FIG. 3 in a CMOS application, transistor 332 and transistor 334 have a substantially symmetric $V_t$. For example, $V_{tp}$ is preferably about $-0.3$ V, and $V_{tn}$ may be the substantially the same positive value, e.g., about $+0.3$ V. The layer of the combination of Hf and Si 106, 206, and 306 sets the work function of the gates 106, 206/220, and 306 or 306/320 of transistor devices 112, 222 and 332, for example.

A Hf—Si gate electrode in accordance with embodiments of the present invention has shown to be an excellent gate material for setting the work function to about 4.0 eV and thus setting the threshold voltage $V_t$ to about 0.3 V for an NMOS transistor. The Hf—Si gate material exhibits band-edge work functions, exhibits work function stability as a function of temperature, and maintains thermal stability with the underlying gate dielectric 104, 204, and 304.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of manufacturing a semiconductor device, the method comprising:
   providing a workpiece;
   forming a gate dielectric material over the workpiece;
   exposing the workpiece to a precursor of hafnium (Hf) and a precursor of silicon (Si) to form a gate material over the gate dielectric material, the gate material comprising a layer of a combination of Hf and Si;
   patterning the gate material and the gate dielectric material to form a gate and a gate dielectric of a transistor, respectively, wherein the gate comprises a first thickness and wherein the ratio of Hf to Si is substantially the same throughout the first thickness of the gate; and
   forming a source region and a drain region in the workpiece proximate the gate dielectric.

2. A method of manufacturing a semiconductor device, the method comprising:
   providing a workpiece;
   forming a gate dielectric material over the workpiece;
   exposing the workpiece to a precursor of hafnium (Hf) and a precursor of silicon (Si) to form a gate material over the gate dielectric material, the gate material comprising a layer of a combination of Hf and Si, wherein exposing the workpiece to the precursor of Hf comprises exposing the workpiece to TDEAH, $Hf(NEt_2)_4$, or TEMAH;
   patterning the gate material and the gate dielectric material to form a gate and a gate dielectric of a transistor, respectively; and
   forming a source region and a drain region in the workpiece proximate the gate dielectric.

3. A method of manufacturing a semiconductor device, the method comprising:
   providing a workpiece;
   forming a gate dielectric material over the workpiece;
   exposing the workpiece to a precursor of hafnium (Hf) and a precursor of silicon (Si) to form a gate material over the gate dielectric material, the gate material comprising a layer of a combination of Hf and Si, wherein exposing the workpiece to the precursor of Si comprises exposing the workpiece to TDMAS, Tetrakis (dimethylamido), $[(CH_2)_2N]_4Si$, or $SiH_4$;
   patterning the gate material and the gate dielectric material to form a gate and a gate dielectric of a transistor, respectively; and
   forming a source region and a drain region in the workpiece proximate the gate dielectric.

4. The method according to claim 1, wherein forming the gate dielectric comprises forming a hafnium-based dielectric, $HfO_2$, $HfSiO_x$, $Al_2O_3$, $ZrO_2$, $ZrSiO_x$, $Ta_2O_5$, $La_2O_3$, nitrides thereof, $Si_xN_y$, SiON, $HfAlO_x$, $HfAlO_xN_{1-x-y}$, $ZrAlO_x$, $ZrAlO_xN_y$, $SiAlO_x$, $SiAlO_xN_{1-x-y}$, $HfSiAlO_x$, $HfSiAlO_xN_y$, $ZrSiAlO_x$, $ZrSiAlO_xN_y$, $SiO_2$, combinations thereof, or multiple layers thereof.

5. The method according to claim 1, further comprising a post deposition anneal (PDA) process.

6. The method according to claim 5, wherein the post deposition anneal process comprises a temperature of about 700 degrees C. in an ambient of $NH_3$.

7. The method according to claim 1, wherein forming the gate material further comprises forming a layer of semiconductive material over the layer of the combination of Hf and Si.

8. A method of manufacturing a semiconductor device, the method comprising:
   providing a workpiece;
   forming a gate dielectric material over the workpiece;
   exposing the workpiece to a precursor of hafnium (Hf) and a precursor of silicon (Si) to form a gate material over the gate dielectric material, the gate material comprising a layer of a combination of Hf and Si, wherein exposing the workpiece to the precursor of Hf and the precursor of Si further comprises forming a gate comprised of about 10% or less of oxygen (O), carbon (C), nitrogen (N), or combinations thereof;
   patterning the gate material and the gate dielectric material to form a gate and a gate dielectric of a transistor, respectively; and
   forming a source region and a drain region in the workpiece proximate the gate dielectric.

9. The method according to claim 1, exposing the workpiece to the precursor of Hf and the precursor of Si comprises forming a first gate of a negative channel metal oxide semiconductor (NMOS) transistor, further comprising forming a second gate comprising a different material than the material of the first gate, the second gate comprising a gate of a positive channel metal oxide semiconductor (PMOS) transistor.

* * * * *

UNITED STATES PATENT AND TRADEMARK OFFICE
CERTIFICATE OF CORRECTION

PATENT NO.        : 7,361,538 B2                                          Page 1 of 1
APPLICATION NO.   : 11/105880
DATED             : April 22, 2008
INVENTOR(S)       : Luan et al.

It is certified that error appears in the above-identified patent and that said Letters Patent is hereby corrected as shown below:

On the Title Page, Item (56) References Cited, OTHER PUBLICATIONS, Page 2, 3rd entry, delete "Lois" and insert --Louis--.
On the Title Page, Item (56) References Cited, OTHER PUBLICATIONS, Page 2, 8th entry, delete "$\leqq$" and insert --$\leq$--.
On the Title Page, Item (56) References Cited, OTHER PUBLICATIONS, Page 2, 9th entry, delete "Transitors" and insert --Transistors--.
In Col. 5, line 33, delete "$SiAlON_{1-x-y}$" and insert --$SiAlO_xN_{1-x-y}$--.
In Col. 6, line 12, delete "$[CH_2)_2N]_4Si$" and insert --$[(CH_2)_2N]_4Si$--.

Signed and Sealed this

Fifteenth Day of July, 2008

JON W. DUDAS
*Director of the United States Patent and Trademark Office*